United States Patent
Zhao et al.

(10) Patent No.: US 9,287,183 B1
(45) Date of Patent: Mar. 15, 2016

(54) USING ELECTROLESS DEPOSITION AS A METROLOGY TOOL TO HIGHLIGHT CONTAMINATION, RESIDUE, AND INCOMPLETE VIA ETCH

(71) Applicant: Lam Research Corporation, Fremont, CA (US)

(72) Inventors: Larry Zhao, Lake Oswego, OR (US); Artur Kolics, Dublin, CA (US); Praveen Nalla, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/675,350

(22) Filed: Mar. 31, 2015

(51) Int. Cl.
 *H01L 21/66* (2006.01)
 *H01L 21/02* (2006.01)
 *H01L 21/768* (2006.01)

(52) U.S. Cl.
 CPC ............ *H01L 22/12* (2013.01); *H01L 21/0206* (2013.01); *H01L 21/02063* (2013.01); *H01L 21/02068* (2013.01); *H01L 21/76831* (2013.01); *H01L 21/76879* (2013.01); *H01L 22/24* (2013.01)

(58) Field of Classification Search
 None
 See application file for complete search history.

(56) References Cited

U.S. PATENT DOCUMENTS

| | | | | | |
|---|---|---|---|---|---|
| 5,674,787 A | * | 10/1997 | Zhao | ..................... | H01L 21/288 257/E21.174 |
| 6,465,352 B1 | * | 10/2002 | Aoki | ......................... | G03F 7/42 257/E21.252 |
| 6,498,384 B1 | * | 12/2002 | Marathe | .................. | H01L 22/14 257/211 |
| 6,528,409 B1 | * | 3/2003 | Lopatin | ................. | H01L 21/288 257/E21.174 |
| 6,908,847 B2 | * | 6/2005 | Saito | ................. | H01L 21/28562 257/E21.171 |
| 6,958,247 B2 | * | 10/2005 | Marxsen | ............. | H01L 21/2885 257/E21.175 |
| 6,964,874 B2 | * | 11/2005 | Werner | ............... | H01L 21/2885 257/E21.175 |
| 7,226,856 B1 | * | 6/2007 | Lopatin | ............. | H01L 21/76843 438/629 |
| 8,043,966 B2 | * | 10/2011 | Basker | ..................... | C25D 5/10 257/E21.117 |
| 2003/0224595 A1 | * | 12/2003 | Smith | ............... | H01L 21/02063 438/637 |
| 2004/0029051 A1 | * | 2/2004 | Koita | .................... | C11D 7/3281 430/313 |
| 2006/0252256 A1 | * | 11/2006 | Weng | ................ | H01L 21/02063 438/637 |
| 2008/0160654 A1 | * | 7/2008 | Meyer | ..................... | H01L 22/12 438/14 |
| 2009/0243109 A1 | * | 10/2009 | Nopper | ............. | H01L 21/76814 257/758 |
| 2009/0255818 A1 | * | 10/2009 | Basker | ..................... | C25D 5/10 205/83 |

* cited by examiner

Primary Examiner — Andres Munoz
(74) Attorney, Agent, or Firm — Martine Penilla Group, LLP (57) ABSTRACT

A method for detecting contamination on a patterned substrate includes: performing a via etch operation on a substrate, wherein the via etch operation is configured to define a via feature on the substrate and expose an etch-stop layer at a bottom of the via feature; performing an etch-stop removal operation on the substrate, wherein the etch-stop removal operation is configured for removing the etch-stop layer at the bottom of the via feature to expose a metallic feature underlying the etch-stop layer; applying an electroless deposition solution to the substrate, the applied electroless deposition solution configured for selectively depositing a metallic material over the exposed metallic feature and on metallic contaminants on exposed surfaces of the substrate, the metallic contaminants being generated from the metallic feature during the etch-stop removal operation; performing an inspection operation on the substrate to identify the metallic contaminants that have been deposited with the metallic material.

17 Claims, 12 Drawing Sheets

USING ELECTROLESS DEPOSITION AS A METROLOGY TOOL TO HIGHLIGHT CONTAMINATION, RESIDUE, AND INCOMPLETE VIA ETCH

FIELD OF THE INVENTION

The present invention relates generally to semiconductor fabrication, and more particularly, to the use of electroless deposition as a metrology tool to highlight contamination, residue, and incomplete via etch for detection purposes.

DESCRIPTION OF THE RELATED ART

Integrated circuits use conductive interconnects to wire together the individual devices on a semiconductor substrate, or to communicate externally to the integrated circuit. Interconnect metallization for vias and trenches may include aluminum alloys and copper. In the dual-damascene process, trenches and holes (for contacts and vias) are etched in the dielectric, then lined with a barrier material, such as tantalum (Ta), tantalum nitride (TaN), or a combination of both films, followed by the deposition of a copper seed layer, copper electroplating, copper planarization using CMP and then deposition of a dielectric stack, such as SiC/low-k/SiC.

Since an oxide readily forms on copper when copper is exposed to air, proper post-CMP cleaning and removal of the copper oxide before capping the copper with SiC is required to ensure good adhesion between copper and SiC. Removal of the copper oxide prior to the SiC deposition is essential to good EM performance and reducing resultant metal resistivity. The copper may be capped with a cobalt-alloy capping layer, such as CoWP (cobalt tungsten phosphide), CoWB (cobalt tungsten boride), or CoWBP (cobalt tungsten borophosphide), before the SiC dielectric bather layer, to improve electro-migration performance as compared to SiC over copper.

Metal contamination, organic residue, and incomplete via etch are some of the major issues that cause yield and reliability issues in semiconductor manufacturing. However, current metrology tools are not adequate for detecting such issues on patterned wafers.

Total reflection x-ray fluorescence (TXRF) is utilized as a standard metrology tool for detecting contamination on blanket wafers. However, TXRF is not suitable for use on patterned wafers, as TXRF provides signal information from metal, but does not provide precise information on the source of the signal. Thus, metal contamination on the surface will be indistinguishable from metal below the surface of a patterned wafer when examined by TXRF.

Top-down scanning electron microscopy (SEM) is another tool utilized to examine a wafer. However, metal contamination can be too small to be visible by top-down SEM. The etch process can produce organic residues, and in low levels, such residues may not be detected by top-down SEM. If such residues are located at the bottom of a via, they will not be visible by top-down SEM. At present, there is no technique available for detecting incomplete etch of a via/contact or detecting residue at the bottom of the via/contact.

It is in this context that embodiments of the invention arise.

SUMMARY

Disclosed are methods and systems for using electroless deposition as a metrology tool to highlight contamination, residue, and incomplete via etch for detection purposes.

Embodiments of the present disclosure provide for the highlighting and detection of metal contamination on the wafer surface after dual damascene patterning and also the indication of where such metal contamination occurs. On a non-contaminated wafer, selective deposition of a metal such as Co is expected to grow only in the via areas because the metal below each via provides a nucleation site for the electroless deposition. However, deposition will also occur at other locations such as trenches or fields if there is contamination there. Thus, in accordance with embodiments disclosed herein, electroless deposition is utilized to amplify/highlight/decorate the contamination locations so that they are easily visible under critical dimension SEM (CD-SEM). A wafer map can be generated to show the contamination locations.

Embodiments of the present disclosure also provide for the highlighting and detection of incomplete via etch or residue at the bottom of a via after dual damascene patterning. The incompletely etched via or residue at the bottom of the via will prevent the electroless deposition process from depositing metal in the via, which again can be easily detected using CD-SEM.

In one embodiment, a method for detecting contamination on a patterned substrate is provided, comprising: performing a via etch operation on a substrate, wherein the via etch operation is configured to define a via feature on the substrate and expose an etch-stop layer at a bottom of the via feature; performing an etch-stop removal operation on the substrate, wherein the etch-stop removal operation is configured for removing the etch-stop layer at the bottom of the via feature to expose a metallic feature underlying the etch-stop layer; applying an electroless deposition solution to the substrate, the applied electroless deposition solution being configured for selectively depositing a metallic material over the exposed metallic feature and on metallic contaminants on exposed surfaces of the substrate, the metallic contaminants being generated from the metallic feature during the etch-stop removal operation; performing an inspection operation on the substrate to identify the metallic contaminants that have been deposited with the metallic material.

In one embodiment, the method further includes: performing a clean operation on the substrate after the etch-stop removal operation and prior to applying the electroless deposition solution, wherein the clean operation is configured for removing the metallic contaminants from the exposed surfaces of the substrate following the etch-stop removal operation; wherein the applied electroless deposition solution is configured for selectively depositing on the metallic contaminants that remain on the exposed surfaces of the substrate following the clean operation.

In one embodiment, the metallic contaminants are not detectable by the inspection operation prior to the application of the electroless deposition solution, and wherein the metallic contaminants define nucleation sites for the selective deposition of the metallic material, wherein the selective deposition of the metallic material on the metallic contaminants provides for an amplification in size of the metallic contaminants so as to become detectable by the inspection operation.

In one embodiment, performing the inspection operation on the substrate includes applying a critical dimension scanning electron microscopy (CD-SEM) technique to the substrate to generate an image, and analyzing the image to identify the metallic contaminants that have been deposited with the metallic material.

In one embodiment, performing the inspection operation further includes defining an inspection template, the inspection template configured to identify a region of the image that includes the via feature and a region of the image that does not include the via feature, the region of the image that does not include the via feature being analyzed to identify the metallic contaminants.

In one embodiment, the inspection operation is further configured to identify whether a blockage exists at the bottom of the via feature that at least partially prevents the electroless deposition solution from depositing the metallic material on the metallic feature.

In one embodiment, performing the inspection operation on the substrate includes applying a critical dimension scanning electron microscopy (CD-SEM) technique to the substrate to generate an image, and analyzing the image to identify an amount of deposition of the metallic material on the metallic feature at the bottom of the via feature, the amount of deposition of the metallic material on the metallic feature indicating whether the blockage exists at the bottom of the via feature.

In one embodiment, the blockage at the bottom of the via feature results from one or more of organic residue or incomplete etching of the via feature.

In one embodiment, the metallic feature and the metallic contaminants generated from the metallic feature are defined by copper metal.

In one embodiment, the metallic material is defined by a metal or alloy containing one or more of cobalt, copper, nickel, and/or palladium.

In another embodiment, a method for detecting contamination on a patterned substrate is provided, comprising: performing a via etch operation on a substrate, wherein the via etch operation is configured to define a plurality of via features on the substrate and expose an etch-stop layer at a bottom of each via feature; performing an etch-stop removal operation on the substrate, wherein the etch-stop removal operation is configured for removing the etch-stop layer at the bottom of each via feature to expose a metallic feature underlying the etch-stop layer; applying an electroless deposition solution to the substrate, the applied electroless deposition solution being configured for selectively depositing a metallic material over the exposed metallic feature and on metallic contaminants on exposed surfaces of the substrate, the metallic contaminants being generated from the metallic feature during the etch-stop removal operation; performing an inspection operation on the substrate to identify the metallic contaminants that have been deposited with the metallic material, wherein the inspection operation is further configured to identify whether a blockage exists at the bottom of one or more of the via features that at least partially prevents the electroless deposition solution from depositing the metallic material on the metallic feature.

In one embodiment, the method further includes: performing a clean operation on the substrate after the etch-stop removal operation and prior to applying the electroless deposition solution, wherein the clean operation is configured for removing the metallic contaminants from the exposed surfaces of the substrate following the etch-stop removal operation; wherein the applied electroless deposition solution is configured for selectively depositing on the metallic contaminants that remain on the exposed surfaces of the substrate following the clean operation.

In one embodiment, the metallic contaminants are not detectable by the inspection operation prior to the application of the electroless deposition solution, and wherein the metallic contaminants define nucleation sites for the selective deposition of the metallic material, wherein the selective deposition of the metallic material on the metallic contaminants provides for an amplification in size of the metallic contaminants so as to become detectable by the inspection operation.

In one embodiment, performing the inspection operation on the substrate includes applying a critical dimension scanning electron microscopy (CD-SEM) technique to the substrate to generate an image, and analyzing the image to identify the metallic contaminants that have been deposited with the metallic material, and further analyzing the image to identify an amount of deposition of the metallic material on the metallic features at the bottoms of the via features, the amount of deposition of the metallic material on the metallic features indicating whether the blockage exists at the bottoms of the via features.

In one embodiment, performing the inspection operation further includes defining an inspection template, the inspection template configured to identify regions of the image that include the via features and regions of the image that do not include the via features, the regions of the image that include the via features being analyzed to determine whether the blockage exists, and the regions of the image that do not include the via features being analyzed to identify the metallic contaminants.

In one embodiment, the blockage at the bottom of the via feature results from one or more of organic residue or incomplete etching of the via feature.

In one embodiment, wherein the metallic feature and the metallic contaminants generated from the metallic feature are defined by copper metal; and, wherein the metallic material is defined by a metal or alloy containing one or more of cobalt, copper, nickel, and/or palladium.

BRIEF DESCRIPTION OF THE DRAWINGS

The invention, together with further advantages thereof, may best be understood by reference to the following description taken in conjunction with the accompanying drawings.

DETAILED DESCRIPTION

Disclosed are methods and systems for the use of electroless deposition as a metrology tool to highlight contamination, residue, and incomplete via etch for detection purposes.

In the following description, numerous specific details are set forth in order to provide a thorough understanding of the present invention. However, it will be apparent to one skilled in the art that the present invention may be practiced without some of these specific details. In other instances, well known process operations and implementation details have not been described in detail in order to avoid unnecessarily obscuring the invention.

Figure 1:
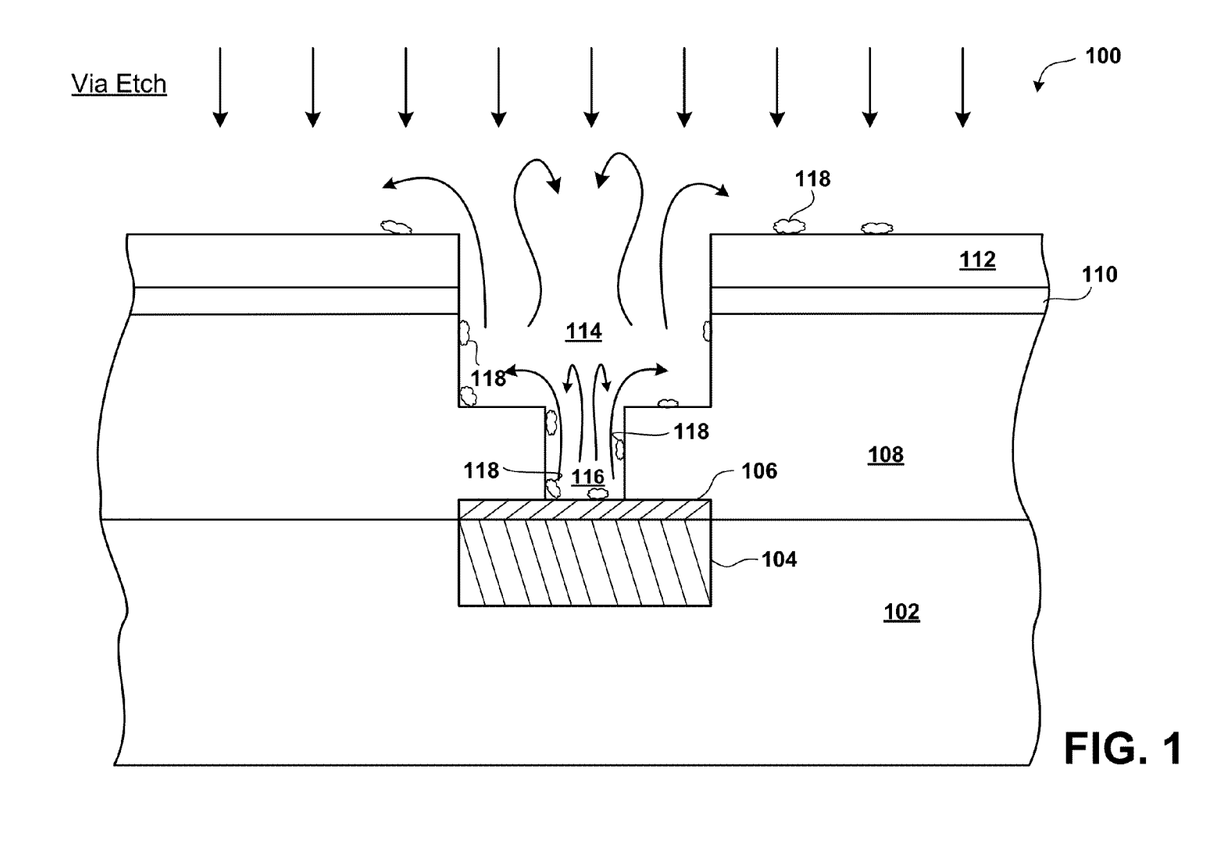
FIG. 1 illustrates a cross-section view of a portion of a substrate undergoing a via etch operation, in accordance with an embodiment of the invention.

FIG. 1 illustrates a cross-section view of a portion of a substrate undergoing a via etch operation, in accordance with an embodiment of the invention. In the illustrated embodiment, the substrate includes a dielectric layer 102 having a metal feature 104 defined therein. In some implementations, the metal feature 104 is composed of a metal/alloy such as copper. Overlying the metal feature 104 is an etch stop layer 106. A connection is to be made to the metal feature 104 from an overlying feature, and hence a dielectric layer 108 is defined on the substrate which will be etched to define the overlying feature. A hard mask layer 110 is defined over the dielectric layer, and a photoresist layer 112 is defined over the hard mask layer 110.

Etch processing is carried out on the substrate 100 to define a trench 114 and a via 116. In some implementations, the trench 114 is etched first, followed by etching of the via 116; whereas in other implementations, the via 116 is etched first, followed by etching of the trench 114. As a result of the etch process, polymer residues 118 can be generated. These residues may adhere to the various exposed surfaces of the substrate 100, including the walls and floors of the trench 114 and via 116. Such residues can be difficult to remove and may remain on the substrate, especially in the trench/via structures, even after subsequent cleaning and processing steps.

Following the via etch operation, the photoresist 112 may be removed by, for example, an ashing operation.

Figure 2:
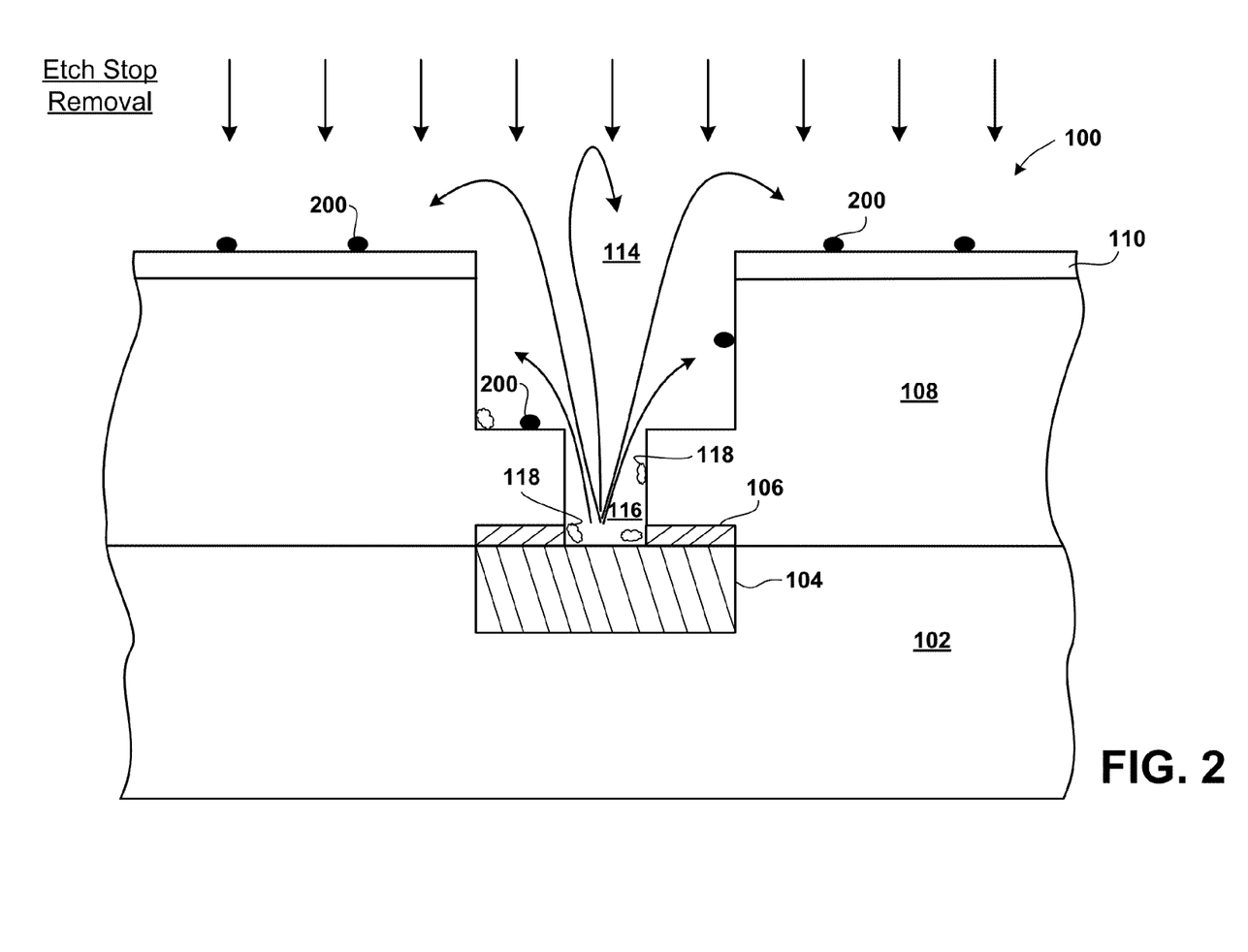
FIG. 2 illustrates the substrate 100 during an etch stop removal operation, in accordance with an embodiment of the invention.

FIG. 2 illustrates the substrate 100 during an etch stop removal operation, in accordance with an embodiment of the invention. During this operation, the portion of the etch stop layer 106 at the bottom of the via 116 is etched away to reveal the underlying metallic feature 104. However, as this occurs, metallic contaminants/particles 200 may be generated from the metallic feature 104 and transported to exposed surfaces of the substrate 100, including the walls and floors of the trench 114 and via 116, as well as on field surfaces of the substrate 100. Such metallic contaminants 200 may persist on the exposed surfaces of the substrate 100 even after a post-etch cleaning operation is performed. Because the metallic contaminants 200 may be atomic scale in size, they may be undetectable my conventional metrology methods such as top-down SEM. And if left untreated, such metallic particles can result in loss of yield.

Also shown at FIG. 2 are polymer residues 118 which may have been generated during the via etch operation and/or subsequent operations. The presence of residues in and around the trench/via can be problematic as they may block subsequent deposition of material to form the interconnect (e.g. barrier/liner deposition (e.g. Ta/N, Ti/N), seed layer deposition (e.g. Cu seed), and bulk fill metal deposition (e.g. Cu fill)). If left untreated, then this condition may result in high resistance or no connection at all through the interconnect, and may therefore cause a loss of yield.

Figure 3:
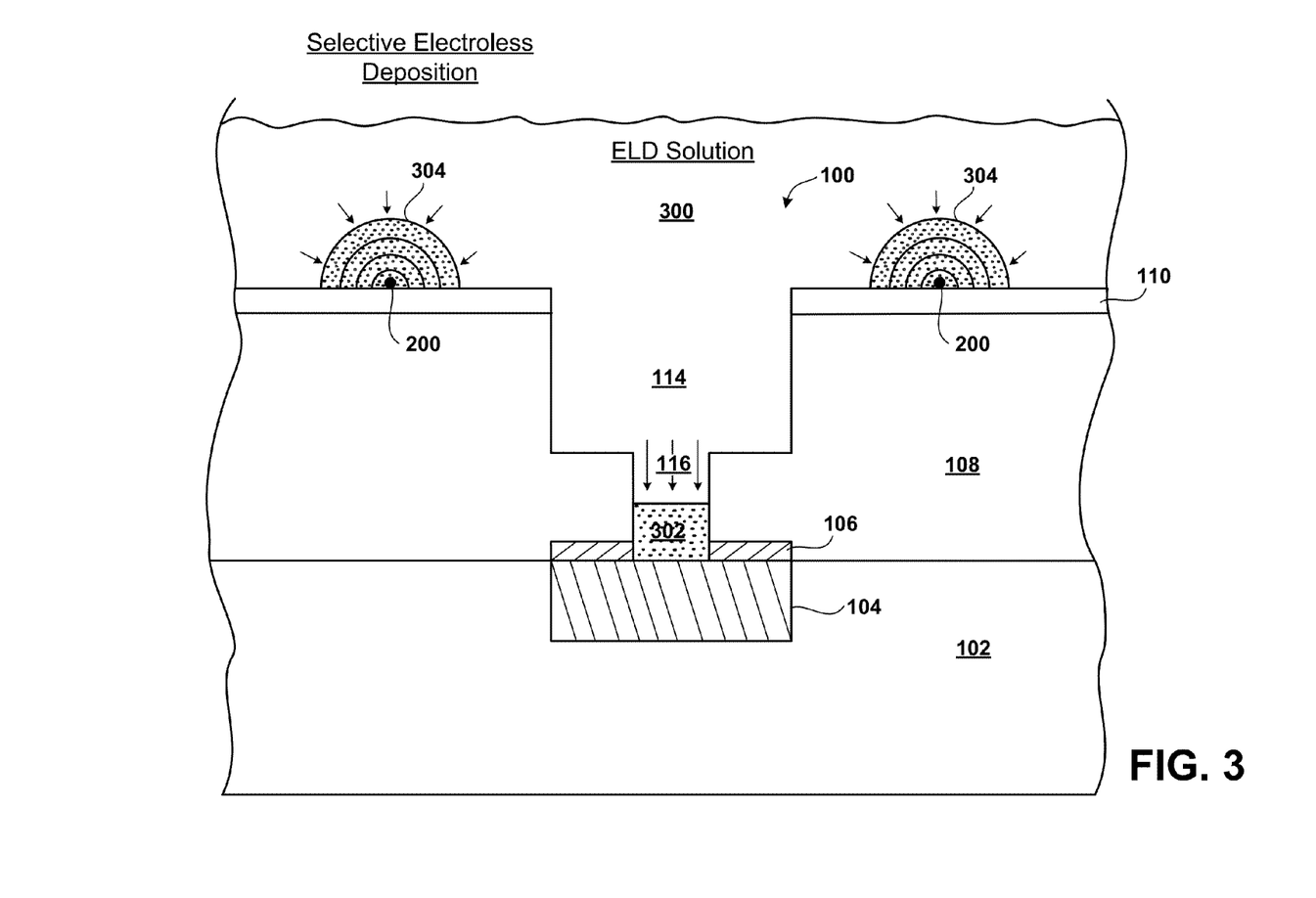
FIG. 3 illustrates the application of an electroless deposition solution 300 on the substrate 100, in accordance with an embodiment of the invention.

FIG. 3 illustrates the application of an electroless deposition solution 300 on the substrate 100, in accordance with an embodiment of the invention. The electroless deposition solution 300 is configured to deposit a metallic material onto other metallic areas of the substrate that serve as nucleation sites for the deposition of the metallic material. The electroless deposition solution 300 may be configured to deposit any metal/alloy which may be suitable for highlighting metallic contamination as described herein, including without limitation, the following: cobalt, copper, nickel, palladium, and alloys thereof.

When the via 116 is clean and substantially free of residues, and the metallic feature 104 is fully exposed at the bottom of the via 116, then the application of the electroless deposition solution 300 will deposit a metallic fill layer 302 of the metallic material onto the exposed portion of the metallic feature 104. Under such circumstances (metallic feature exposed and via free of residue), the application of the electroless deposition solution 300 is configured in some implementations to provide for deposition of the metallic fill 302 to a thickness of approximately 300 angstroms to 600 angstroms over the metallic feature 104. In some implementations, the deposition is configured to provide for deposition of the metallic fill 302 to a thickness of approximately 400 to 500 angstroms over the metallic feature 104. In still other implementations, the deposition is configured to provide for deposition of the metallic fill 302 to a thickness of approximately 200 to 700 angstroms over the metallic feature 104.

In some implementations, the electroless deposition solution 300 is configured to deposit cobalt metal, and thus the deposition creates a cobalt fill 302 over the metallic feature 104. In some implementations, the metallic feature 104 consists of copper metal, and thus a cobalt fill 302 is formed over a copper feature 104.

It will be appreciated that if residues such as polymer residues 118 (shown at FIG. 2) are present in the via 116, then they will reduce or even prevent the deposition of the metallic material from the electroless deposition solution 300 in the via 116. Thus, the metallic fill layer 302 in the via 116 will be reduced or possibly eliminated under such circumstances.

If metallic particles contaminate the surfaces of the substrate 100, such as in the field areas as shown, then such metallic contaminants will act as nucleation sites for the deposition of the metallic material from the electroless deposition solution 300. Consequently, the electroless deposition solution 300 will deposit metallic material 304 onto the metallic contaminants/particles 200, effectively increasing the size of the metallic contaminants so as to be visible by CD-SEM or another inspection method (e.g. bright field/dark field inspection tool).

The metallic contaminants 200 are thus amplified by the application of an electroless deposition solution which selectively deposits metallic material onto metallic regions such as are provided by the metallic contaminants 200. The effect of residues in the via 116 will also be detectable through observation of a lack of deposition of metallic material in the via 116 when such is expected. These effects can be seen in CD-SEM images of the substrate 100.

It will be appreciated that the electroless deposition solution may be configured to have any formulation that is suitable for the purpose of highlighting metallic contaminants on a substrate surface. More specifically, the electroless deposition solution should be configured to selectively deposit metallic material on metallic surfaces (such as that provided by metallic contaminants and exposed surfaces of metallic features) while not depositing on other surfaces of the substrate (such as those provided by the hard mask, dielectric, etch stop layers, polymer residues, etc.). Thus, in accordance with various embodiments, the electroless deposition solution is configured to be stable so that it does not plate out on non-metallic surfaces, while providing for selective plating on metallic surfaces that act as nucleation sites for deposition.

It will be appreciated that the specific structures shown and described with reference to the supplied figures are provided by way of example only, without limitation. Those skilled in the art will appreciate that there may be additional layers defined as part of the substrate structures, e.g. barrier, liner, capping, etc., and that such may be practiced without departing from the scope of the present embodiments.

Figure 4A:
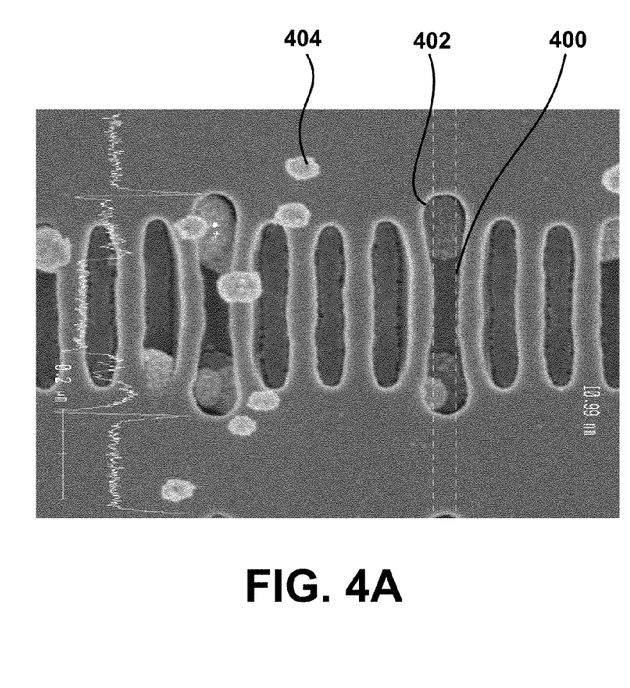
FIG. 4A is an SEM image of a portion of a substrate surface after the application of an electroless deposition solution for highlighting metallic contaminants and detecting blockage in vias, in accordance with an embodiment of the invention.

FIG. 4A is an SEM image of a portion of a substrate surface after the application of an electroless deposition solution for highlighting metallic contaminants and detecting blockage in vias, in accordance with an embodiment of the invention. As shown, several features have been etched in the substrate surface, and an electroless cobalt deposition solution has been applied to the substrate surface. The etched feature 400 has an elongated shape with via holes defined at the ends. The etching of the via holes is configured to expose a surface of an underlying copper feature. Thus, application of the electroless cobalt deposition solution is expected to deposit cobalt metal in the via over the underlying copper feature. In the illustrated embodiment, the presence of cobalt (reference 402) deposited at the bottom of a via can be seen, thus indicating that the via is not blocked (e.g. by polymer residues or incomplete etch). However, if the via is blocked, then the deposition of cobalt in the via would be reduced or eliminated, and this would be reflected in the SEM image.

Under ideal circumstances, there is no metallic contamination on the substrate surface. However, if such contamination is present, then the electroless cobalt deposition solution will deposit cobalt on the metallic contaminants present on the substrate surface. In the SEM image of FIG. 4A, this can be seen at, for example, particle 404, which is a metallic contaminant that has been coated with cobalt from the electroless deposition solution.

Figure 4B:
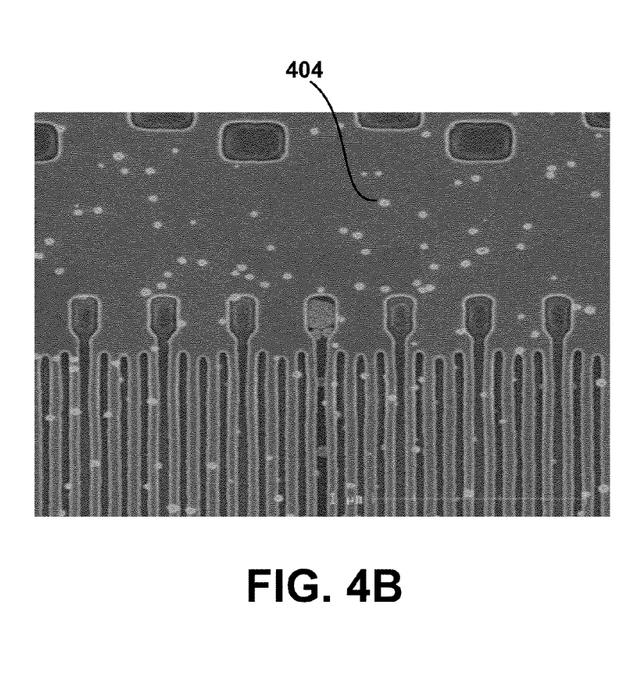
FIG. 4B is an SEM image of a portion of a substrate surface after the application of an electroless deposition solution for highlighting metallic contaminants and detecting blockage in vias, in accordance with an embodiment of the invention.

FIG. 4B is an SEM image of a portion of a substrate surface after the application of an electroless deposition solution for highlighting metallic contaminants and detecting blockage in vias, in accordance with an embodiment of the invention. As shown, the field region of the wafer includes numerous metallic contaminants 404 which have been amplified by the deposition of cobalt from the electroless deposition process. Such metallic contaminants would not have been detectable by visual inspection absent the application of the electroless deposition process which selectively deposits on metallic surfaces.

Figure 5A:
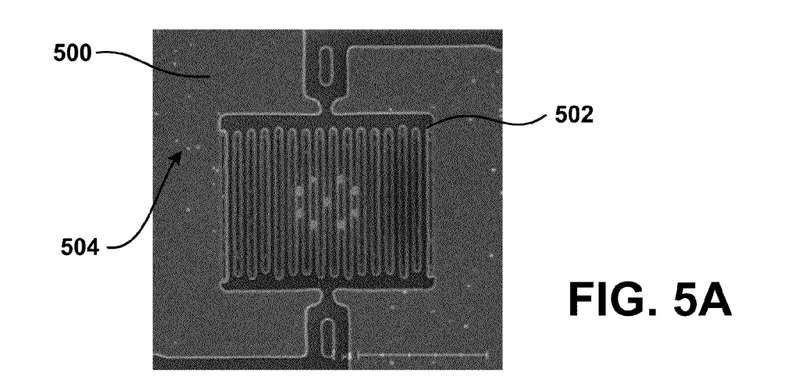
FIG. 5A is an SEM image of a portion of a substrate surface after the application of an electroless deposition solution for highlighting metallic contaminants and detecting blockage in vias, in accordance with an embodiment of the invention.

FIG. 5A is an SEM image of a portion of a substrate surface after the application of an electroless deposition solution for highlighting metallic contaminants and detecting blockage in vias, in accordance with an embodiment of the invention. The portion shown includes a field region 500 of the substrate and a feature region 502 containing etched features, including vias. In the field region 500, particles 504 are visible in the image, which are metallic contaminants that have been deposited with cobalt from the electroless deposition solution. The metallic contaminants can be copper particles which have been removed from an underlying copper feature during via etching and transported to the field region 500.

Figure 5B:
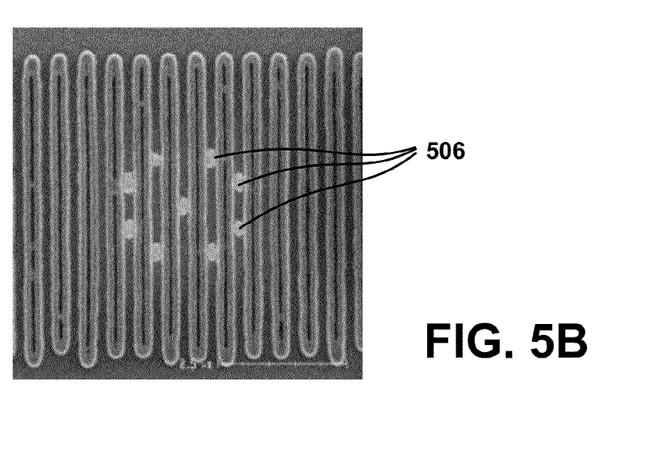
FIGS. 5B and 5C respectively show increasingly magnified views of the portion of the feature region 502 in which the vias are defined, in accordance with the embodiment of FIG. 5A.
Figure 5C:
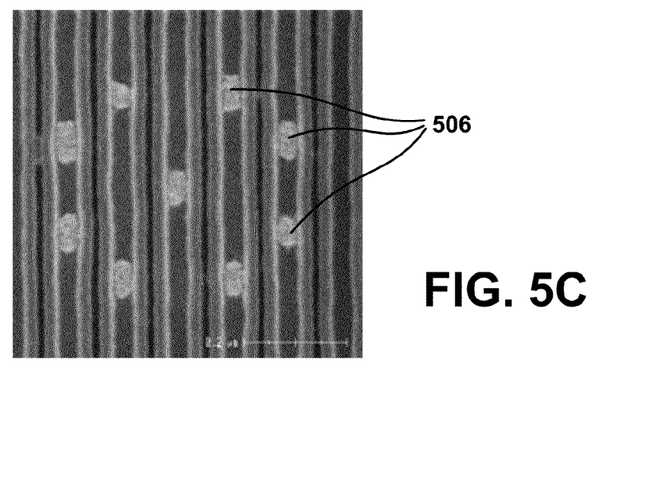

FIGS. 5B and 5C respectively show increasingly magnified views of the portion of the feature region 502 in which the vias are defined. Cobalt fills 506 have been deposited in the via holes by the electroless deposition process, thus indicating that the vias are substantially free of residues.

Figure 6A:
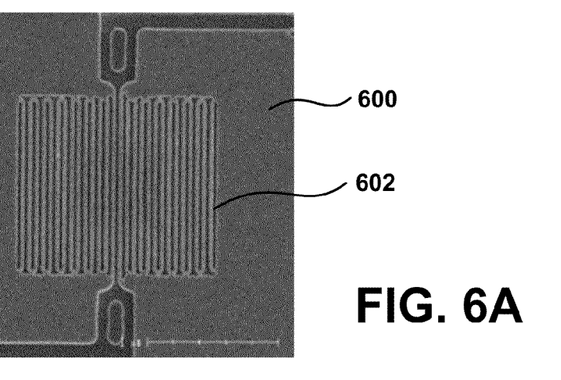
FIG. 6A is an SEM image of a portion of a substrate surface after the application of an electroless deposition solution for highlighting metallic contaminants and detecting blockage in vias, in accordance with an embodiment of the invention.
Figure 6B:
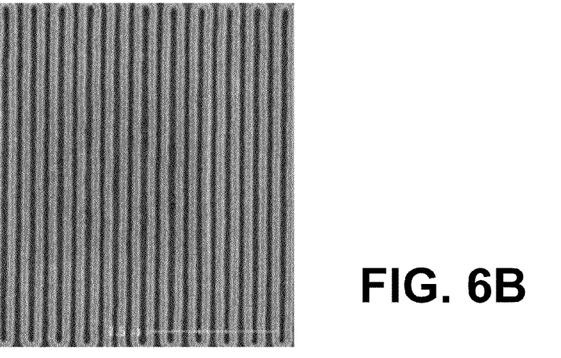
FIGS. 6B and 6C respectively show increasingly magnified views of the portion of the feature region 602 in which the vias are defined, in accordance with the embodiment of FIG. 6A.
Figure 6C:
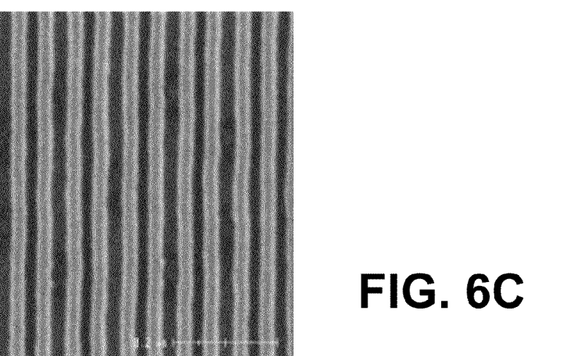

FIG. 6A is an SEM image of a portion of a substrate surface after the application of an electroless deposition solution for highlighting metallic contaminants and detecting blockage in vias, in accordance with an embodiment of the invention. The portion shown includes a field region 600 of the substrate and a feature region 602 containing etched features, including vias. FIGS. 6B and 6C respectively show increasingly magnified views of the portion of the feature region 602 in which the vias are defined. The vias of the substrate shown at FIGS. 6A, 6B, and 6C are located in a similar position as the vias of the substrate shown at FIGS. 5A, 5B, and 5C. However, as shown in FIGS. 6A, 6B, and 6C, there is no deposition in the vias due to the presence of residues which have prevented the electroless deposition solution from accessing and depositing cobalt in the vias.

Figure 7:
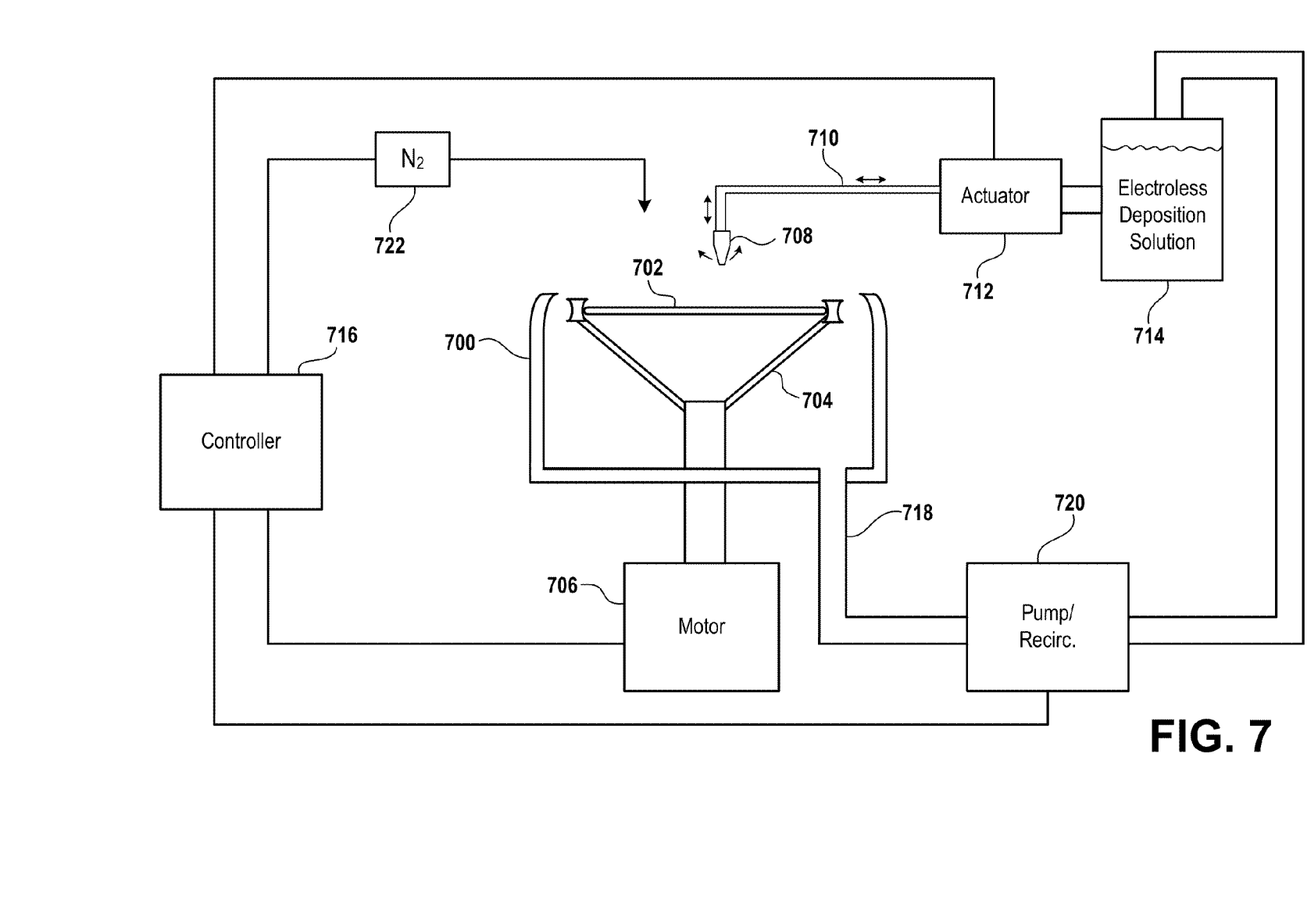
FIG. 7 schematically illustrates an electroless deposition system for performing electroless deposition operations, in accordance with an embodiment of the invention.

FIG. 7 schematically illustrates an electroless deposition system for performing electroless deposition operations, in accordance with an embodiment of the invention. A chamber 700 is provided in which a semiconductor wafer 702 rotates. Wafer 702 resides on a substrate support 704 (or chuck) which is configured to impart rotational motion to wafer 702. Chamber 700 is outfitted with a drain 718 that allows various liquid streams provided to chamber 700 to be removed for waste treatment and/or recirculation. A pump/recirculation module 720 is operable by the controller to manage the pumping, treatment, and recirculation of electroless deposition solution 714. It should be appreciated that in other embodiments, the used electroless deposition solution is not recirculated, but is instead expelled from the system as waste by the pump module 720.

A motor 706 controls the rotation of substrate support 704. Motor 706 should be easy to control and should smoothly transition between various rotational speeds. It may reside within or without chamber 700. In some embodiments, to protect against damage from liquids present in the chamber, motor 706 resides outside of chamber 700 and is separated there from by a seal through which a rotating shaft passes. Any wobble in the shaft on rotation should be small (~<0.05 millimeters for example) so that the location of fluid nozzles with respect to the wafer does not vary substantially, nor shake the wafer from its center while it is not confined by alignment or clamping members. Motor 706 can rapidly accelerate and decelerate (in a controlled fashion) substrate support 704 and wafer 702 at rotation rates between 0 and about 2000 rpm. The motor speed and other operations should be controllable by the controller 716.

Substrate support 704 may be of any suitable design that holds wafer 702 in position during various rotational speeds. It may also facilitate alignment of wafer 702 for the electroless deposition process. The substrate support 704 may include rollers or other shaped holders which are configured to securely grip the wafer along its outer edge.

Chamber 700 may be of any suitable design that confines liquid within its interior and allows delivery of various fluids to wafer 702. It should be constructed of material that is resistant to the fluids to be applied to the wafer and include ports and nozzles for the various liquid and gaseous streams used during deposition and cleaning. The inner surface of the chamber can be contoured to deflect electroless deposition solution escaping from the top surface of the substrate and direct the deflected electroless deposition solution away from the substrate surface and towards the drain.

Gaseous nitrogen is provided from a source of nitrogen 722 to the chamber 700 to provide a substantially oxygen-free controlled ambient environment.

The electroless deposition solution 714 is applied to the wafer 702 via a nozzle 708. The nozzle 708 is coupled to an adjustable arm 710 whose movement is controlled by an actuator 712. The arm 710 can be configured to allow precise control over the positioning and direction of the nozzle 708. Additionally, the nozzle 708 can be adjustable to provide for a stream or spray having a predefined flow rate, velocity, and angle of dispersion, to provide for an even distribution of the electroless deposition solution over the wafer. The combination of the control over the arm 710 and the nozzle 708 can provide for 0 to 0.2 mm accuracy of solution placement, so that the electroless deposition solution can be applied to the wafer with high precision.

Figure 8:
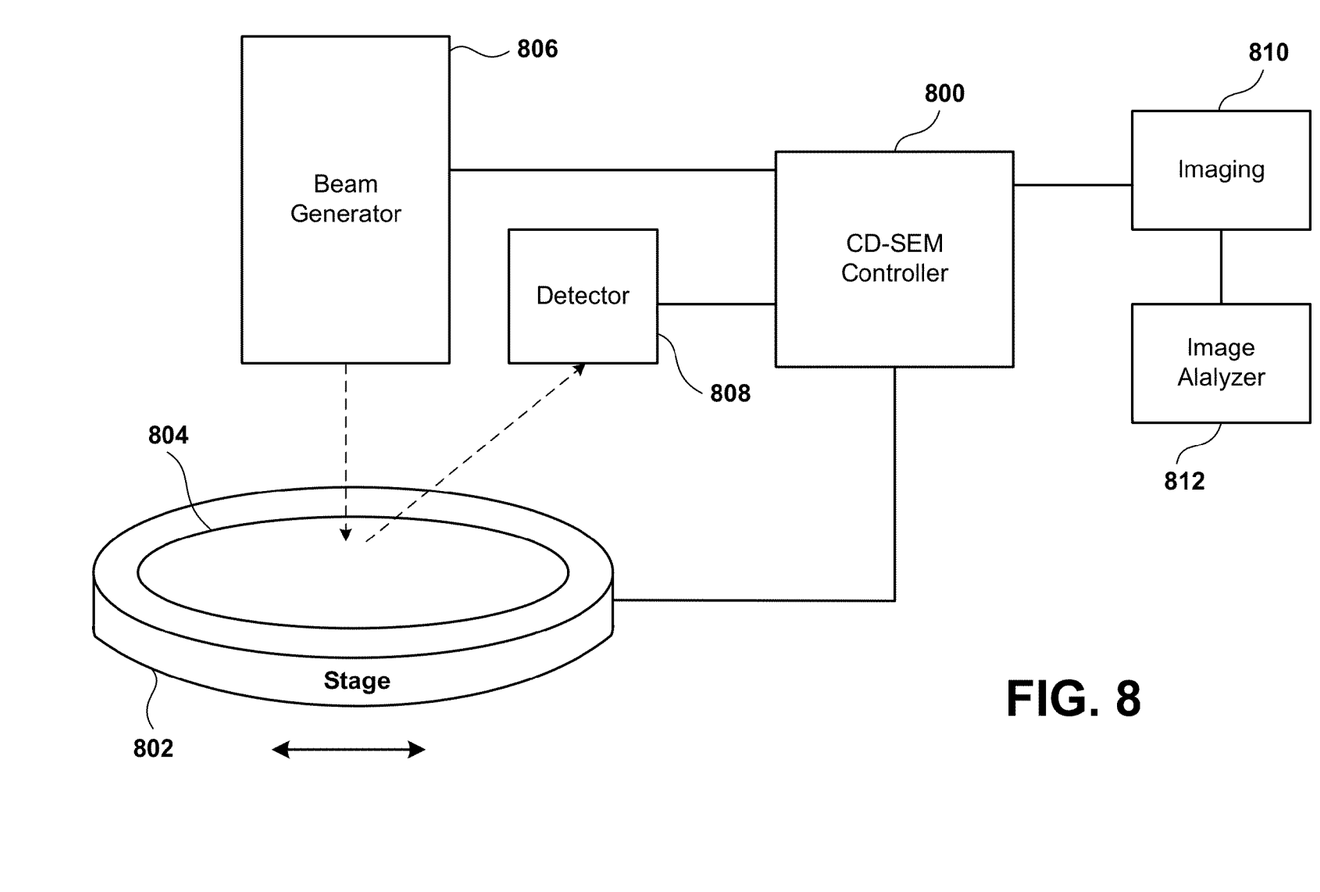
FIG. 8 illustrates a critical dimension scanning electron microscope (CD-SEM) system, in accordance with an embodiment of the invention.

FIG. 8 illustrates a CD-SEM system, in accordance with an embodiment of the invention. The system includes a programmable controller 800 that is configurable to control the operation of the CD-SEM system. A stage 802 is configured to support a wafer 804. In some implementations, the stage 802 is movable for positioning the wafer 804 to generate SEM images of specific portions of the wafer 804. An electron beam 28 is generated by a beam generator 806 and directed toward the wafer 804. The beam generator can include various elements for generating, shaping, focusing, and directing the electron beam, such as an emission element, electromagnetic lens, and scanner.

The electron beam causes secondary electrons and back-scattered electrons to be released from the wafer surface, which are collected by a detector 808. The detector 808 generates detection signals based on the collected electrons, and these signals are subsequently processed by a signal analyzer/imaging module 810 to generate an image and/or measurement information. It will be appreciated that detection signals may be digitized and undergo filtering or other types of signal processing to produce an SEM image.

An image analyzer 812 is configured to analyze SEM images generated by the system to identify metallic contaminants and/or polymer residues. The image analyzer 812 may be provided with a wafer template, which provides location information regarding etched features (e.g. vias) and field regions of the substrate to enable the image analyzer to determine where deposited metallic material from the electroless deposition operation is expected (e.g. in the vias) and where such deposited metallic material indicates metallic contamination. The image analyzer 812 can be configured to identify the locations of metallic contaminants as well as the locations of blocked vias in accordance with the analytical methods described above.

Figure 9:
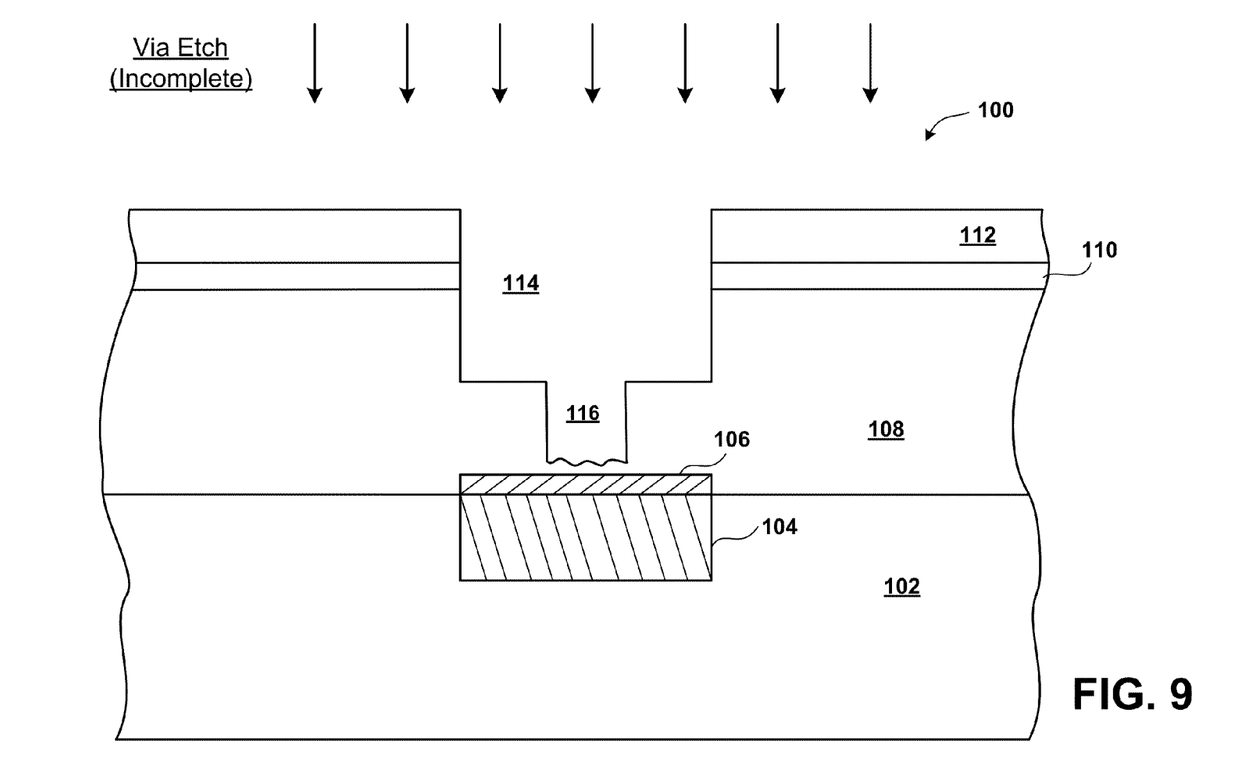
FIG. 9 illustrates a portion of a substrate surface in which a via etch is incomplete, in accordance with an embodiment of the invention.

Another issue that may prevent proper formation of an interconnect is incomplete etching. FIG. 9 illustrates a portion of a substrate surface in which a via etch is incomplete, in accordance with an embodiment of the invention. As shown, the etching of the via 116 has not fully removed the dielectric 108 at the bottom of the via 116 so as to expose the etch stop layer 106. Such incomplete etching of the via will prevent proper formation of the interconnect and cause loss of yield. In accordance with the methods discussed herein, such will also prevent an electroless deposition solution from depositing in the via 116, which will be readily ascertainable from SEM images as has been discussed above.

Figure 10A:
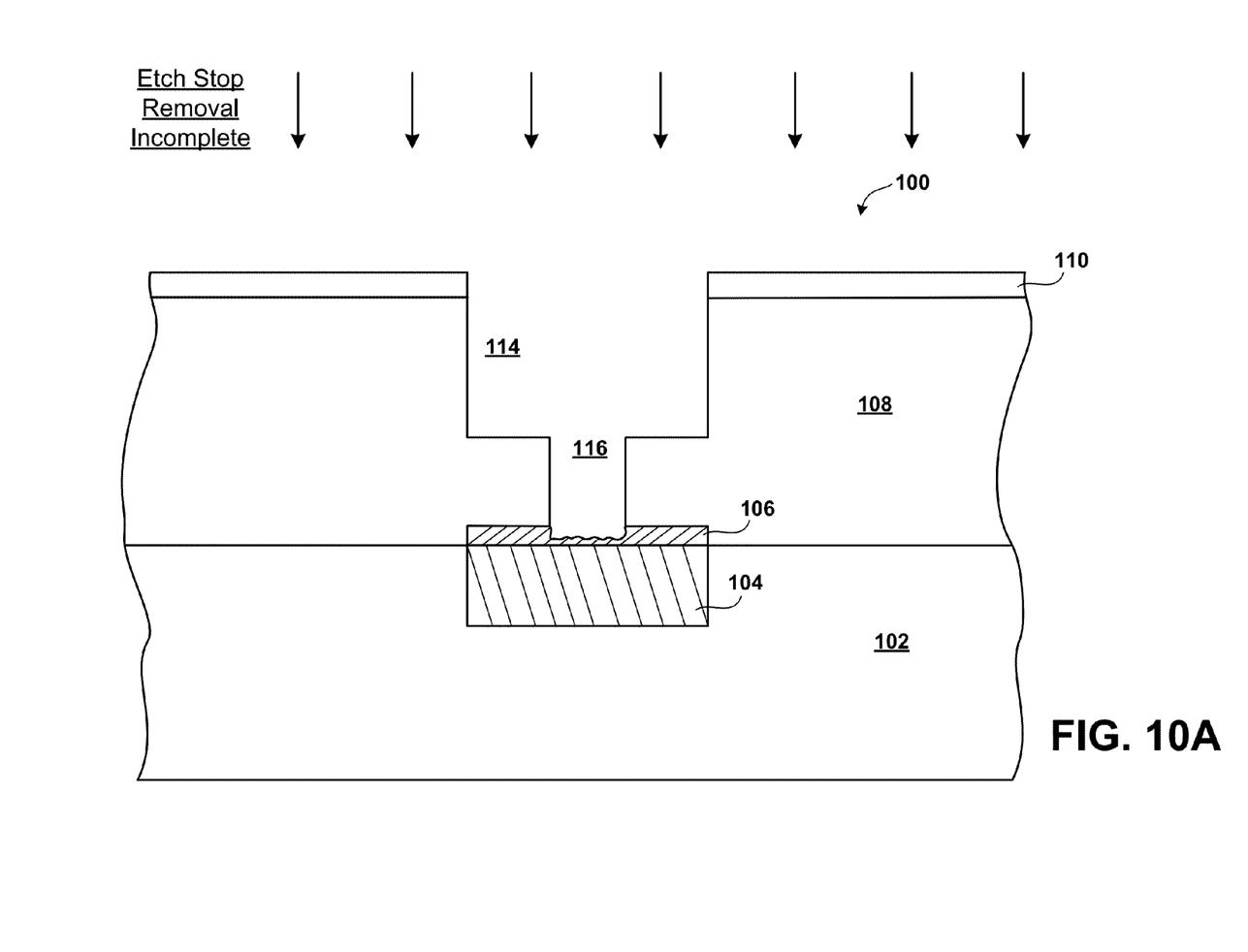
FIG. 10A illustrates a portion of a substrate surface in which the removal of an etch stop layer at the bottom of a via is incomplete, in accordance with an embodiment of the invention.

FIG. 10A illustrates a portion of a substrate surface in which the removal of an etch stop layer at the bottom of a via is incomplete, in accordance with an embodiment of the invention. As shown, the etching of the etch stop layer 106 has not fully removed the etch stop layer 106 at the bottom of the via 116 so as to expose the underlying metallic feature 104. The incomplete removal of the etch stop layer will prevent proper formation of the interconnect and cause loss of yield. In accordance with the methods discussed herein, such will also prevent an electroless deposition solution from depositing in the via 116, which will be readily ascertainable from SEM images as has been discussed above.

It will be appreciated that the presently described systems and methods for detecting metallic contaminants, polymer residues, and incomplete etch are especially useful during process development, to identify wafer processing issues which may result in loss of yield or negatively impact circuit performance and reliability. As applied in the embodiments described above, metallic contaminants and/or blocked vias can be identified at the time of formation, without the need to complete processing of the wafer to form a circuit for testing purposes. This can significantly reduce the amount of time and effort required to identify such issues. By way of example, the metallic contaminants or polymer residues are found to be issues, then this may lead to further refinement of etch processes and/or clean processes.

Figure 10B:
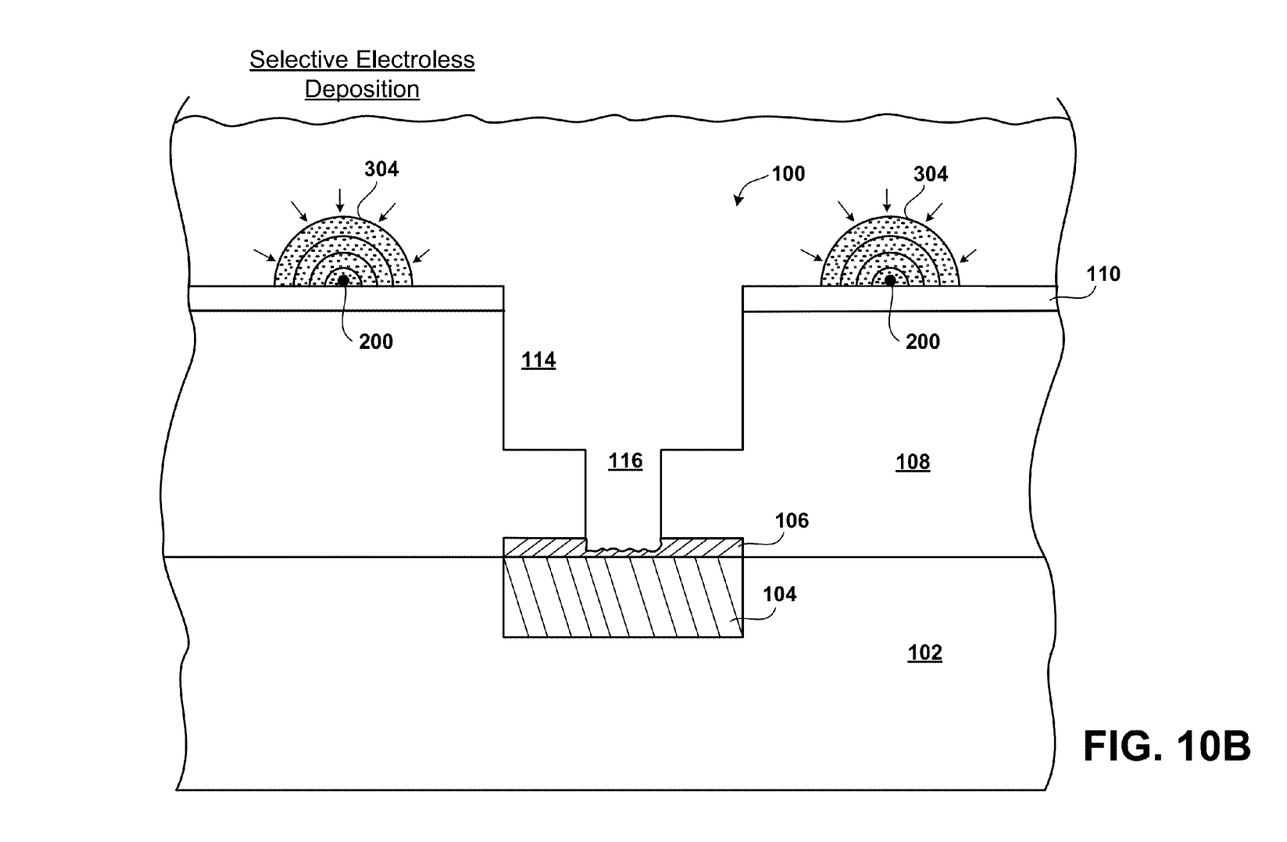
FIG. 10B illustrates a portion of a substrate surface following the application of a selective electroless deposition solution, in accordance with the embodiment of FIG. 10A.

FIG. 10B illustrates a portion of the substrate surface following the application of a selective electroless deposition solution, in accordance with the embodiment of FIG. 10A. As can be seen, the electroless deposition solution has selectively deposited metallic material on metallic surfaces, including depositing the metallic material 304 on metallic contaminant particles 200 (which may have been generated during etching of adjacent/other vias on the same substrate). However, no deposition of metallic material occurs in the via 116, because the underlying metallic feature 104 is not exposed as the etch stop layer 106 has not been completely removed at the bottom of the via. And thus there is no metallic surface in the via 116 to serve as a nucleation site for deposition of metallic material from the electroless deposition solution. As noted above, this can be identified from analysis of an SEM image of the substrate following the electroless deposition. Vias that have been etched sufficiently to fully remove the dielectric and etch stop to expose the underlying metallic feature will exhibit deposition from the electroless deposition solution, whereas vias that have not been etched sufficiently will not exhibit deposition from the electroless deposition solution.

Figure 11:
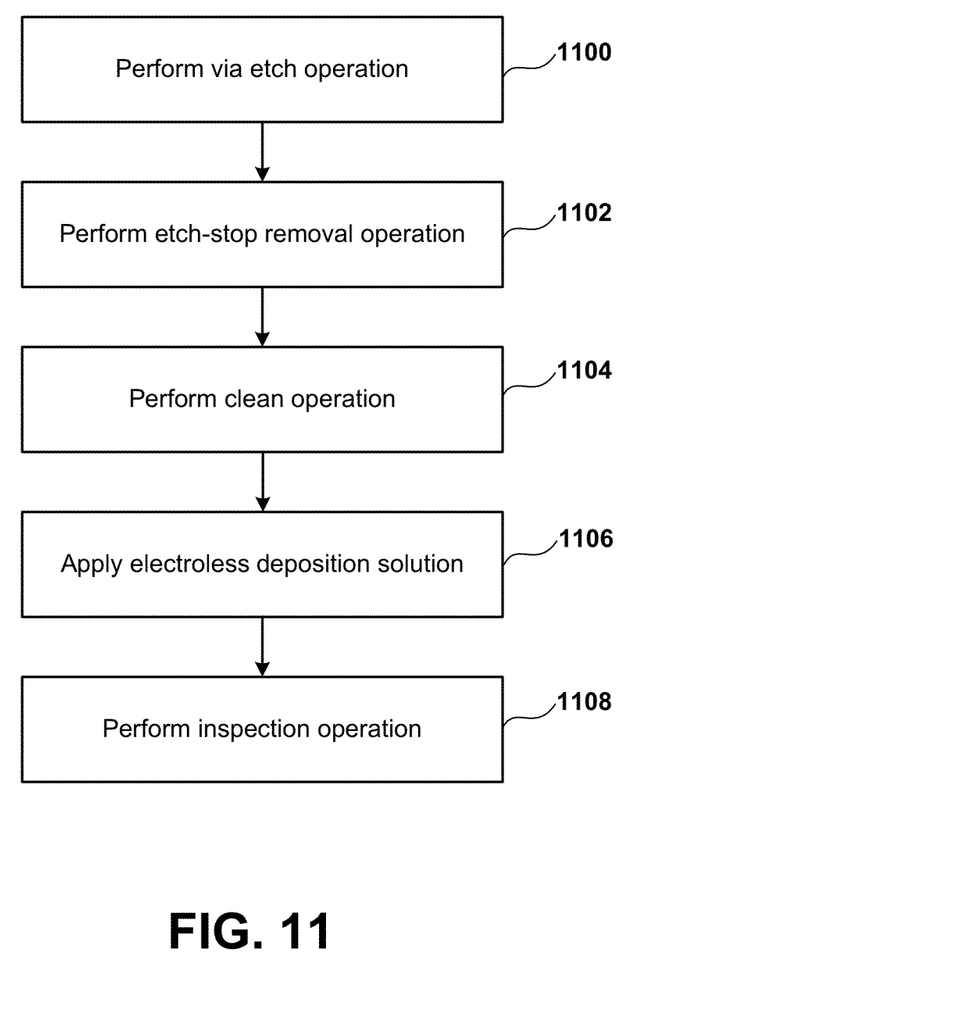
FIG. 11 illustrates a method for identifying post-etch contamination on a patterned substrate, in accordance with an embodiment of the invention.

FIG. 11 illustrates a method for identifying post-etch contamination on a patterned substrate, in accordance with an embodiment of the invention. At method operation 1100, a via etch operation is performed on a substrate, wherein the via etch operation is configured to define a via feature on the substrate and expose an etch-stop layer at a bottom of the via feature. At method operation 1102, an etch-stop removal operation is performed on the substrate, wherein the etch-stop removal operation is configured for removing the etch-stop layer at the bottom of the via feature to expose a metallic feature underlying the etch-stop layer. At method operation 1104, a clean operation is performed on the substrate, wherein the clean operation is configured for removing metallic contaminants from the exposed surfaces of the substrate following the etch-stop removal operation.

At method operation 1106, an electroless deposition solution is applied to the substrate, wherein the applied electroless deposition solution is configured for selectively depositing a metallic material over the exposed metallic feature and on metallic contaminants that remain on exposed surfaces of the substrate. At method operation 1108, an inspection operation is performed on the substrate to identify the metallic contaminants that have been deposited with the metallic material. The inspection operation 1108 is further configured to identify whether a blockage exists at the bottom of the via feature that at least partially prevents the electroless deposition solution from depositing the metallic material on the metallic feature.

While this invention has been described in terms of several embodiments, it will be appreciated that those skilled in the art upon reading the preceding specifications and studying the drawings will realize various alterations, additions, permutations, and equivalents thereof. It is therefore intended that the present invention includes all such alterations, additions, permutations, and equivalents as fall within the true spirit and scope of the invention.

What is claimed is:

1. A method for detecting contamination on a patterned substrate, comprising:
    performing a via etch operation on a substrate, wherein the via etch operation is configured to define a via feature on the substrate and expose an etch-stop layer at a bottom of the via feature;
    performing an etch-stop removal operation on the substrate, wherein the etch-stop removal operation is configured for removing the etch-stop layer at the bottom of the via feature to expose a metallic feature underlying the etch-stop layer;
    applying an electroless deposition solution to the substrate, the applied electroless deposition solution being configured for selectively depositing a metallic material over the exposed metallic feature and on metallic contaminants on exposed surfaces of the substrate, the metallic contaminants being generated from the metallic feature during the etch-stop removal operation;
    performing an inspection operation on the substrate to identify the metallic contaminants that have been deposited with the metallic material.

2. The method of claim 1, further comprising:
    performing a clean operation on the substrate after the etch-stop removal operation and prior to applying the electroless deposition solution, wherein the clean operation is configured for removing the metallic contaminants from the exposed surfaces of the substrate following the etch-stop removal operation;
    wherein the applied electroless deposition solution is configured for selectively depositing on the metallic contaminants that remain on the exposed surfaces of the substrate following the clean operation.

3. The method of claim 1, wherein the metallic contaminants are not detectable by the inspection operation prior to the application of the electroless deposition solution, and wherein the metallic contaminants define nucleation sites for the selective deposition of the metallic material, wherein the selective deposition of the metallic material on the metallic contaminants provides for an amplification in size of the metallic contaminants so as to become detectable by the inspection operation.

4. The method of claim 1, wherein performing the inspection operation on the substrate includes applying a critical dimension scanning electron microscopy (CD-SEM) technique to the substrate to generate an image, and analyzing the image to identify the metallic contaminants that have been deposited with the metallic material.

5. The method of claim 4, wherein performing the inspection operation further includes defining an inspection template, the inspection template configured to identify a region of the image that includes the via feature and a region of the image that does not include the via feature, the region of the image that does not include the via feature being analyzed to identify the metallic contaminants.

6. The method of claim 1, wherein the inspection operation is further configured to identify whether a blockage exists at the bottom of the via feature that at least partially prevents the electroless deposition solution from depositing the metallic material on the metallic feature.

7. The method of claim 6, wherein performing the inspection operation on the substrate includes applying a critical dimension scanning electron microscopy (CD-SEM) technique to the substrate to generate an image, and analyzing the image to identify an amount of deposition of the metallic material on the metallic feature at the bottom of the via feature, the amount of deposition of the metallic material on the metallic feature indicating whether the blockage exists at the bottom of the via feature.

8. The method of claim 6, wherein the blockage at the bottom of the via feature results from one or more of organic residue or incomplete etching of the via feature.

9. The method of claim 1, wherein the metallic feature and the metallic contaminants generated from the metallic feature are defined by copper metal.

10. The method of claim 1, wherein the metallic material is defined by a metal or alloy containing one or more of cobalt, copper, nickel, and/or palladium.

11. A method for detecting contamination on a patterned substrate, comprising:
    performing a via etch operation on a substrate, wherein the via etch operation is configured to define a plurality of via features on the substrate and expose an etch-stop layer at a bottom of each via feature;
    performing an etch-stop removal operation on the substrate, wherein the etch-stop removal operation is configured for removing the etch-stop layer at the bottom of each via feature to expose a metallic feature underlying the etch-stop layer;
    applying an electroless deposition solution to the substrate, the applied electroless deposition solution being configured for selectively depositing a metallic material over the exposed metallic feature and on metallic contaminants on exposed surfaces of the substrate, the metallic contaminants being generated from the metallic feature during the etch-stop removal operation;
    performing an inspection operation on the substrate to identify the metallic contaminants that have been deposited with the metallic material, wherein the inspection operation is further configured to identify whether a blockage exists at the bottom of one or more of the plurality of via features that at least partially prevents the electroless deposition solution from depositing the metallic material on the metallic feature.

12. The method of claim 11, further comprising:
performing a clean operation on the substrate after the etch-stop removal operation and prior to applying the electroless deposition solution, wherein the clean operation is configured for removing the metallic contaminants from the exposed surfaces of the substrate following the etch-stop removal operation;
wherein the applied electroless deposition solution is configured for selectively depositing on the metallic contaminants that remain on the exposed surfaces of the substrate following the clean operation.

13. The method of claim 11, wherein the metallic contaminants are not detectable by the inspection operation prior to the application of the electroless deposition solution, and wherein the metallic contaminants define nucleation sites for the selective deposition of the metallic material, wherein the selective deposition of the metallic material on the metallic contaminants provides for an amplification in size of the metallic contaminants so as to become detectable by the inspection operation.

14. The method of claim 11, wherein performing the inspection operation on the substrate includes applying a critical dimension scanning electron microscopy (CD-SEM) technique to the substrate to generate an image, and analyzing the image to identify the metallic contaminants that have been deposited with the metallic material, and further analyzing the image to identify an amount of deposition of the metallic material on the metallic features at the bottoms of the plurality of via features, the amount of deposition of the metallic material on the metallic features indicating whether the blockage exists at the bottoms of the plurality of via features.

15. The method of claim 14, wherein performing the inspection operation further includes defining an inspection template, the inspection template configured to identify regions of the image that include the plurality of via features and regions of the image that do not include the plurality of via features, the regions of the image that include the plurality of via features being analyzed to determine whether the blockage exists, and the regions of the image that do not include the plurality of via features being analyzed to identify the metallic contaminants.

16. The method of claim 11, wherein the blockage at the bottom of one or more of the plurality of via features results from one or more of organic residue or incomplete etching of the plurality of via features.

17. The method of claim 11,
wherein the metallic feature and the metallic contaminants generated from the metallic feature are defined by copper metal; and
wherein the metallic material is defined by a metal or alloy containing one or more of cobalt, copper, nickel, and/or palladium.

* * * * *